US006803819B2

(12) United States Patent
Kim

(10) Patent No.: US 6,803,819 B2
(45) Date of Patent: Oct. 12, 2004

(54) VARIABLE GAIN AMPLIFIER HAVING IMPROVED GAIN SLOPE CHARACTERISTIC AND LINEARITY

(75) Inventor: Seyeob Kim, Seoul (KR)

(73) Assignee: Integrant Technologies Inc., Kyunggi-do (KR)

( * ) Notice: Subject to any disclaimer, the term of this patent is extended or adjusted under 35 U.S.C. 154(b) by 0 days.

(21) Appl. No.: 10/445,804

(22) Filed: May 28, 2003

(65) Prior Publication Data

US 2003/0222717 A1 Dec. 4, 2003

(51) Int. Cl.[7] ................................................. H03F 3/45
(52) U.S. Cl. ..................................... 330/254; 330/253
(58) Field of Search .............................. 330/254, 253; 327/359

(56) References Cited

U.S. PATENT DOCUMENTS

| 5,477,191 A | * | 12/1995 | Demicheli | .................. 330/254 |
| 5,757,230 A | | 5/1998 | Mangelsdorf | |
| 5,768,700 A | * | 6/1998 | Kardontchik | ................ 455/333 |
| 6,201,443 B1 | | 3/2001 | Tanji | |
| 6,734,736 B2 | * | 5/2004 | Gharpurey | .................. 330/254 |

OTHER PUBLICATIONS

Danilo Manstretta, Rinaldo Castello, Francesco Gatta, Paolo Rossi, Francesco Svelto "A 0.18 μm CMOS Direct–Conversion Receiver Front–End for UMTS" ISSCC 2002 / Session 14 / Cellular RF Wireless / 14.6 Feb. 5, 2002, pp. 240–241, 2002 IEEE International Solid–State Circuits Conference.

* cited by examiner

Primary Examiner—Henry Choe
(74) Attorney, Agent, or Firm—Shinjyu Global IP Counselors, LLP

(57) ABSTRACT

The present invention relates to improvement of gain slope characteristic and linearity of a variable gain amplifier. According to the present invention, a variable gain amplifier is proved, which comprises an amplification unit having first input terminal, second input terminal, first output terminal, and second output terminal, and outputs current through the first and the second output terminals according to voltages applied to the first and the second input terminals, respectively, first gain control unit having an input terminal, first output terminal, second output terminal, first control terminal, second control terminal, and comprising first and second active elements which make current flow through the first and the second output terminal according to voltages applied to the first and the second control terminals, respectively, and second gain control unit having an input terminal, first output terminal, second output terminal, first control terminal, second control terminal, and comprising third and fourth active elements which make current flow through the first and the second output terminal according to voltages applied to the first and the second control terminals, respectively, wherein amplification rates of the first and the third active elements are substantially same, each other, and amplification rates of the second and the fourth active elements are substantially same, each other, and, amplification rate of the first and the third active elements are substantially different with amplification rate of the second and the fourth active elements.

5 Claims, 6 Drawing Sheets

VARIABLE GAIN AMPLIFIER HAVING IMPROVED GAIN SLOPE CHARACTERISTIC AND LINEARITY

TECHNICAL FIELD

The present invention relates to the communication system, more specifically, to a variable gain amplifier having improved gain slope characteristic and linearity.

BACKGROUND OF THE INVENTION

A variable gain amplifier is generally used for maintaining a desired output level in the communication system.

A prior art of a variable gain amplifier may be found in U.S. Pat. No. 5,757,230. The variable gain amplifier of the 230' patent uses a linearized transconductor in conjunction with an output circuit. The transconductor has a transconductance that varies in response to a first control signal while the output circuit has a transresistance that varies in response to a second control signal. Both control signals are provided by a gain controller circuit portion. The voltage gain of the amplifier is equal to the product of the transconductance and the transresistance. The amplifier can be configured to provide an exponential gain. The amplifier of the U.S. Pat. No. 5,757,230 patent is a complicated device requiring as many as 50 transistors to implement.

Another variable gain amplifier may be found in U.S. Pat. No. 6,201,443. The variable gain amplifier of the U.S. Pat. No. 6,201,443 includes a first gain cell, a second gain cell that is operably connected to the first gain cell, and a current control circuit portion that is operably connected to the first and second gain cells. The first gain cell has a transconductance and preferably comprises a pair of MOSFETs. The second gain cell has a transconductance and also preferably comprises a pair of MOSFETs. The first and second gain cells receive an input signal and produce an output signal that is amplified in proportion to their transconductance. The current control circuit portion controls the amount of current sent to the first and second gain cells and, as such, also controls their transconductance. The transconductance of the first gain cell is designed to be larger by a predetermined amount than the transconductance of the second gain cell for a given amount of current.

The variable gain amplifier has some problems in scope of gain control because gain slope of the amplifier is steep. Further, a non-linear characteristic of the variable gain amplifier is the main reason for deterioration of the performance of the whole circuit of the communication system.

SUMMARY OF THE INVENTION

The object of the present invention is to provide a variable gain amplifier whose gain slope characteristic is improved.

Another object of the present invention is to provide a variable gain amplifier whose gain is controlled widely by fixing minimum value of gain.

Another object of the present invention is to provide a variable gain amplifier whose linearity is improved by controlling degeneration impedance value.

Another object of the present invention is to provide a variable gain amplifier that amplifies an input signal with high gain when small signal is inputted, and amplifies an input signal with high linearity when large signal is inputted.

DETAILED DESCRIPTION

The First Embodiment of the Variable Gain Amplifier

Figure 1:
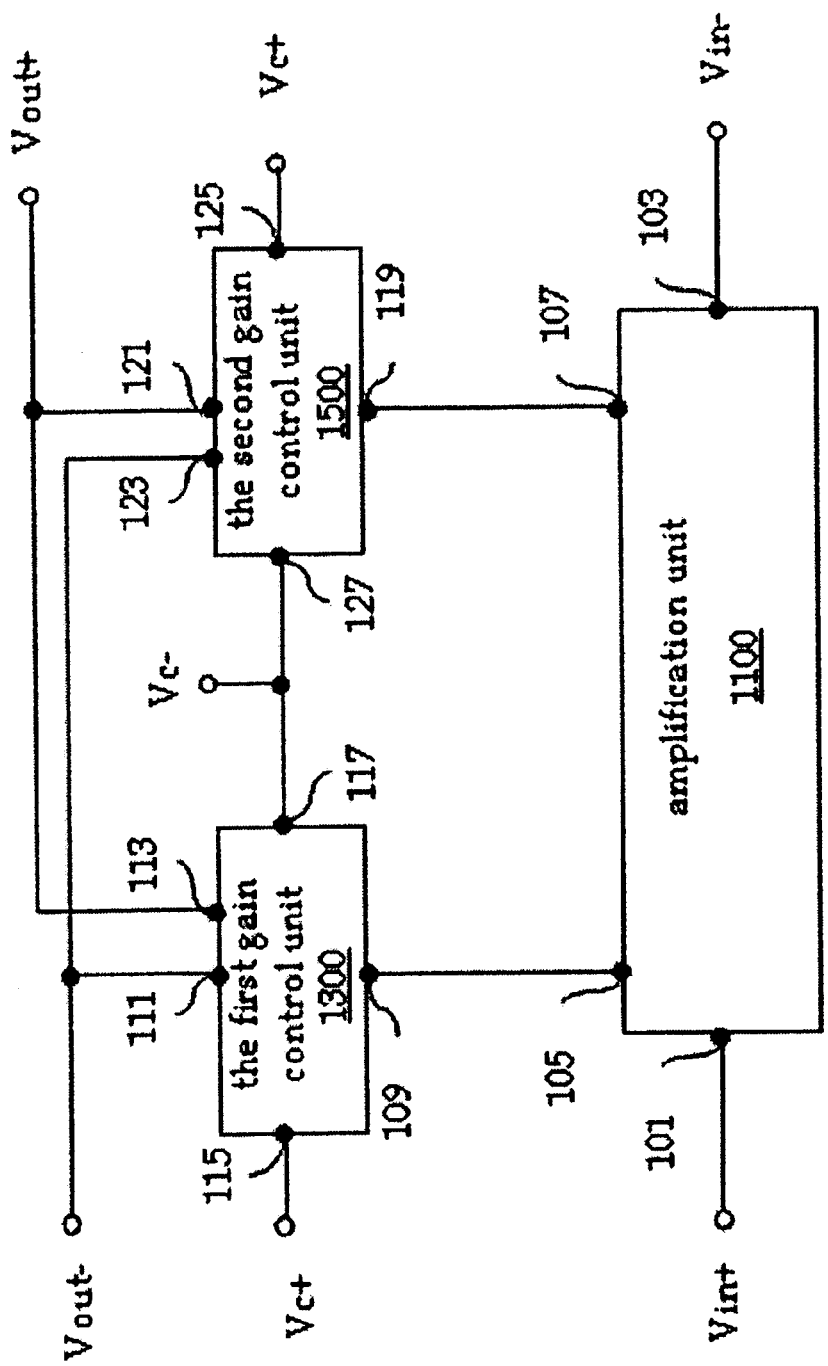
FIG. 1 is a block diagram showing a variable gain amplifier according to the first embodiment of the present invention.

FIG. 1 is a block diagram showing a variable gain amplifier according to the first embodiment of the present invention.

As shown in FIG. 1, the variable gain amplifier according to the present invention comprises an amplification unit 1100, the first gain control unit 1300, and the second gain control unit 1500.

The amplification unit 1100 has the first and second input terminals 101, 103, and the first and the second output terminals 105, 107. The amplification unit 1100 amplifies input signals applied to the first and the second input terminals, differentially, and outputs the amplified signals to the first and the second output terminals, respectively.

The first gain control unit 1300 has an input terminal 109, the first and the second output terminals 111, 113, and the first and the second control terminals 115, 117. The first gain control unit 1300 controls current flowing through the first and the second output terminals 111, 113 according to control signals Vc+, Vc− applied to the first and the second control terminal 115, 117, respectively.

The second gain control unit 1500 has an input terminal 119, the first and the second output terminals 121, 123, and the first and the second control terminals 125, 127. The second gain control unit 1500 controls current flowing through the first and the second output terminal 121, 123 according to control signals Vc+, Vc− applied to the first and the second control terminal 125, 127, respectively.

Below, connections of these constructions are illustrated with referring FIG. 1.

The first and the second input terminals 101, 103 of the amplification unit 1100 form + input terminal Vin+, and − input terminal Vin− of the variable gain amplifier according to the present invention, respectively. The first output terminal 105 of the amplification unit 1100 is connected to the input terminal 109 of the first gain control unit 1300, and the second output terminal 107 of the amplification unit 1100 is connected to the input terminal 119 of the second gain control unit 1500.

The first output terminal 111 of the first gain control unit 1300 is connected to the second output terminal 123 of the second gain control unit 1500, and forms − output terminal Vout− of the variable gain amplifier. Moreover, the first output terminal 121 of the second gain control unit 1500 is connected to the second output terminal 113 of the first gain control unit 1300, and forms + output terminal Vout+ of the variable gain amplifier.

The first control terminals 115, 125 of the first and the second gain control units 1300, 1500 are connected to each other, and forms + control terminal Vc+ of the variable gain amplifier. The second control terminals 117, 127 of the first and the second gain control units 1300, 1500 are connected to each other, and forms − control terminal Vc− of the variable gain amplifier.

Figure 2:
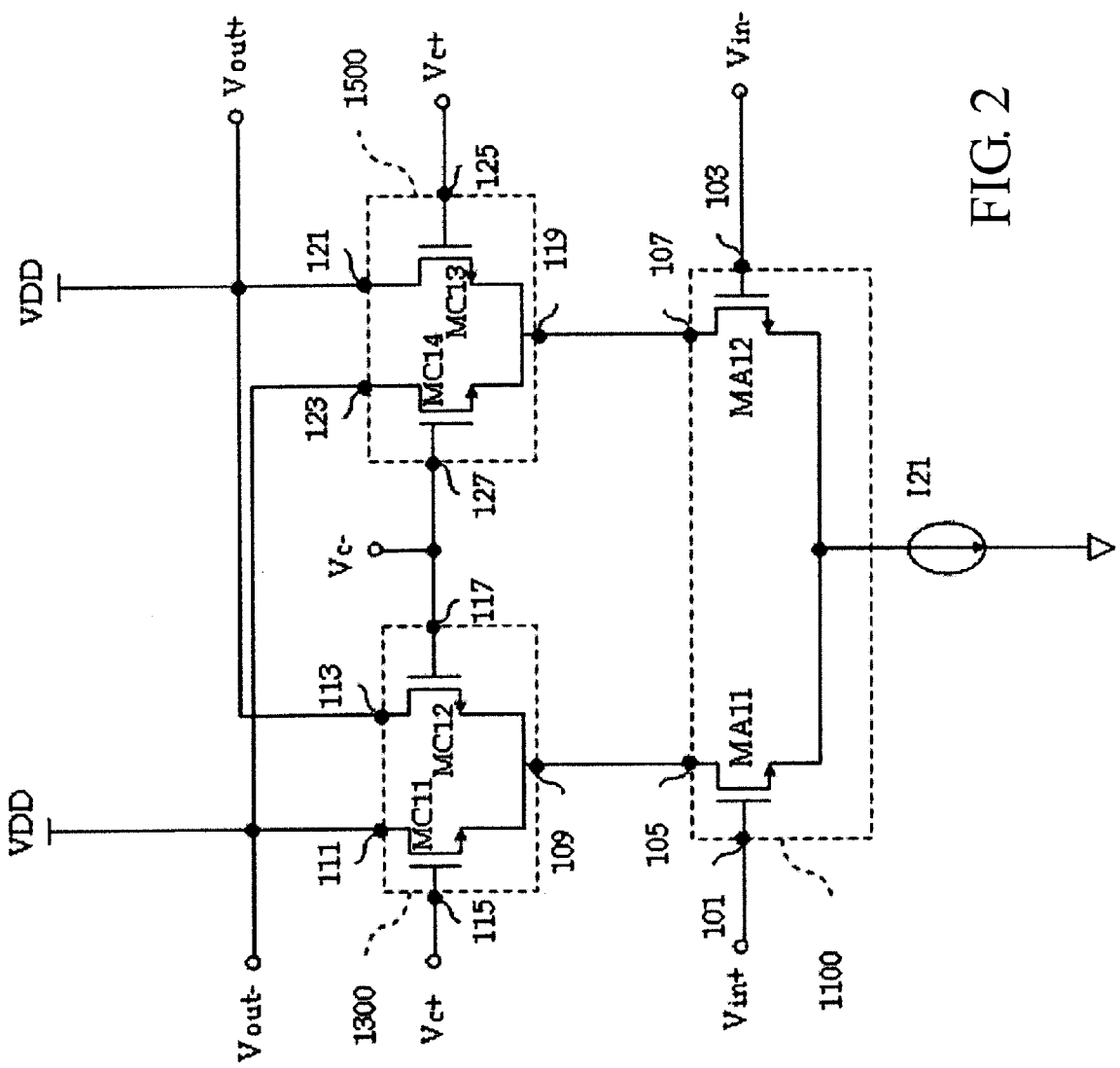
FIG. 2 is a detailed circuit diagram illustrating the variable gain amplifier shown in FIG. 1 according to an embodiment of the present invention.
Figure 3:
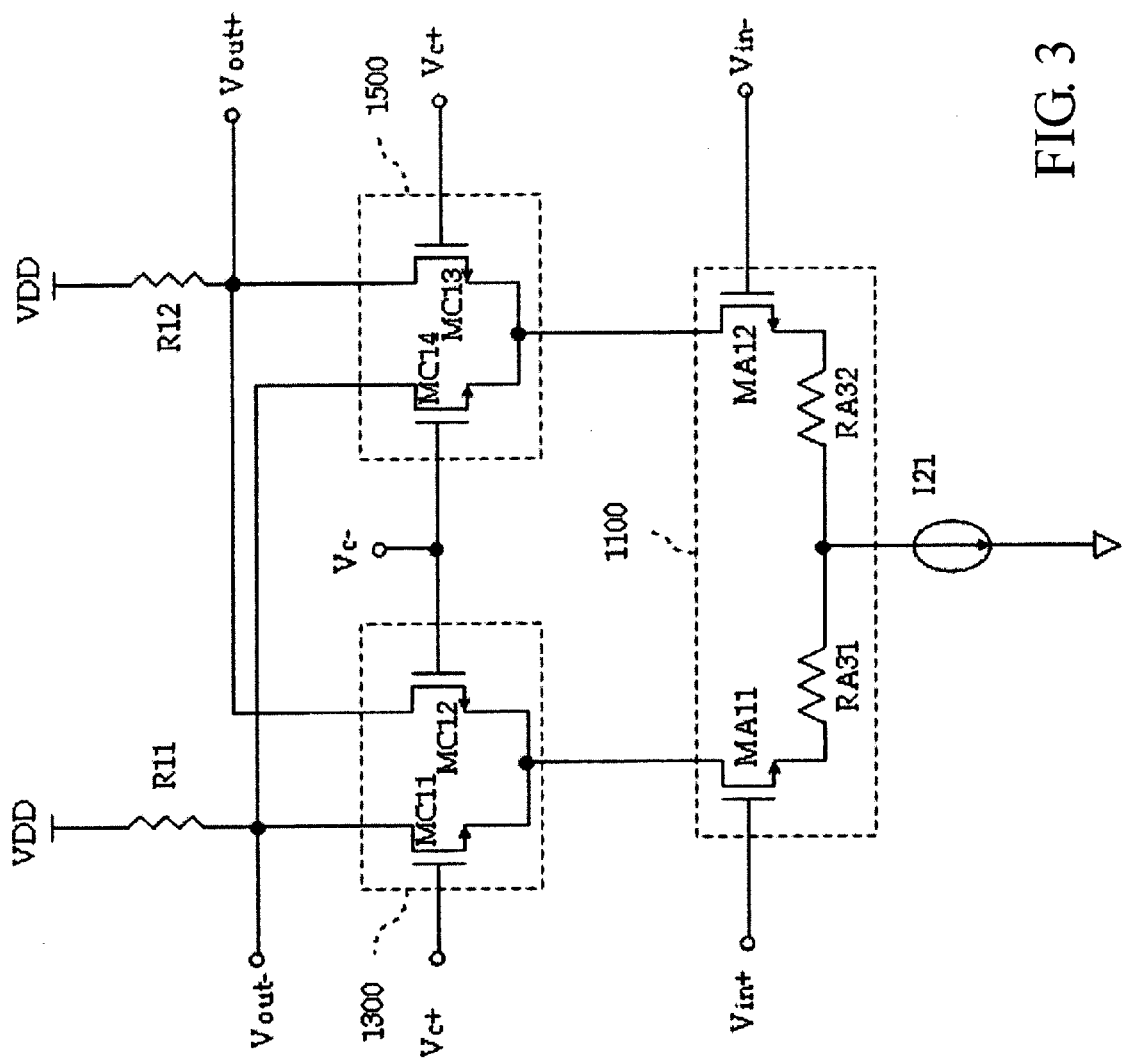
FIG. 3 is a detailed circuit diagram illustrating the variable gain amplifier shown in FIG. 1 according to another embodiment of the present invention.

FIG. 2 and 3 are detailed circuit diagrams illustrating the variable gain amplifier shown in FIG. 1 according to an embodiment of the present invention.

The variable gain amplifier according to the present invention utilizes six active elements MA11, MA12, MC11, MC12, MC13, and MC14. Each active elements has a gate gn, source sn and drain dn. The active element has a characteristic that the direction and the quantity of current flowing from the drain dn to the source sn or vice versa are determined according to the polarity and the amount of the voltage applied to the gate gn and the source sn. Active elements having such characteristic includes bipolar junction transistor (BJT), junction field effect transistor (JFET), metal oxide semiconductor field effect transistor (MOSFET), and metal semiconductor field effect transistor (MESFET).

Some active elements have body terminal bn besides the gate gn, source sn, and drain dn. Such active elements have a characteristic that the direction and the quantity of current flowing from the source sn to the drain dn or vice versa are determined according to the polarity and the amount of the voltage applied to the gate gn and the body dn. Active elements having such characteristic includes metal oxide semiconductor field effect transistor (MOSFET).

It will be described using MOSFET as an example. However, the spirit of the present invention can be applied to all active elements which can be used as an amplifier as well as the MOSFET. Therefore, the idea and the scope of the present invention is not confined to the MOSFET though the description is concentrated to the MOSFET in this specification.

FIGS. 2 and 3 shows that all of the active elements MA11, MA12, MC11, MC12, MC13, and MC14 are N-type MOSFETs, and the description will be concentrated to the N-type MOSFET. However, it is apparent to those skilled in the art that the complementary circuit to the circuit shown in FIGS. 2 and 3 may be composed using the complementary elements of N-type MOSFET.

As shown in FIG. 2, the amplification unit 1100 comprises the first and the second active elements MA11, MA12, and controls a current flowing through the first and the second output terminals 105, 107 in accordance with voltages applied to the first and the second input terminal 101, 103. The drains of the first and the second active elements MA11, MA12 form the first and the second output terminals 105, 107 of the amplification unit 1100, respectively. The gates of the first and the second active elements MA11, MA12 form the first and the second input terminals 101, 103 of the amplification unit 1100, respectively. Moreover the sources of the first and the second active elements MA11, MA12 are connected to each other. Preferably, the first and the second impedances RA31, RA32 are connected to the sources of the first and the second active elements MA11, MA12, respectively, and another terminal of the first and the second impedances RA31, RA32 are connected to each other, as shown in FIG. 3.

The first gain control unit 1300 comprises the first and the second active elements MC11, MC12, and controls a current flowing through the first and the second output terminals 115, 113 in accordance with control voltages Vc+, Vc− applied to the first and the second control terminal 115, 117, respectively.

Drains of the first and the second active elements MC11, MC12 form the first and the second output terminals 111, 113 of the first gain control unit 1300, respectively. Gates of the first and the second active elements MC11, MC12 form the first and the second control terminals 115, 117 of the first gain control unit 1300, respectively. Sources of the first and the second active elements MC11, MC12 are connected to each other, and form the input terminal 109 of the first gain control unit 1300.

The second gain control unit 1500 comprises the third and the fourth active elements MC13, MC14. The second gain control unit 1500 controls currents flowing through the first and the second output terminals 121, 123 in accordance with control voltages Vc+, Vc− applied to the first and the second control terminals 125, 127, respectively.

Drains of the third and the fourth active elements MC13, MC14 form the first and the second output terminals 121, 123 of the second gain control unit 1500, respectively. Gates of the third and the fourth active elements MC13, MC14 form the first and the second control terminals 125, 127 of the second gain control unit 1500, respectively. Sources of the third and the fourth active elements MC13, MC14 are connected to each other, and forms the input terminal 119 of the second gain control unit 1500.

As shown in FIG. 2, the variable gain amplifier formed with NMOS transistors according to an embodiment, may further comprises a current source 121 which is connected between connection point of sources of the first and the second active elements MA11, MA12 and ground. Further, in case that the first and the second impedances RA31, RA32 are connected to the sources of the first and the second active elements MA11, MA12, respectively, the current source 121 is provided between connection point of another terminals of the first and the second impedances RA31, RA32 and ground, as shown in FIG. 3.

As shown in FIG. 2, the first output terminals 111, 121 of the first and the second gain control unit 1300, 1500 are connected to the voltage source VDD. Moreover, impedances are preferably provided between the first output terminals 111, 121 of the first and the second gain control units 1300, 1500 and the voltage source VDD, respectively, as shown in FIG. 3.

According to the present invention, amplification rate of the first active element MC11 of the first gain control unit 1300 and amplification rate of the third active element MC13 of the second gain control unit 1500 are substantially same, each other. Moreover, amplification rate of the second active element MC12 of the first gain control unit 1300 and amplification rate of the fourth active element MC14 of the second gain control unit 1500 are substantially same, each other. However, the amplification rates of the first and the third active elements MC11, MC13 and the amplification rates of the second and the fourth active elements MC12, MC14 are substantially different.

As shown in FIG. 2, in case that the active elements are NMOS transistors, a gate width of the first active element MC11 of the first gain control unit 1300 and a gate width of the third active element MC13 of the second gain control unit 1500 are substantially same, each other. Moreover, a gate width of the second active element MC12 of the first gain control unit 1300 and a gate width of the fourth active element MC14 of the second gain control unit 1500 are substantially same, each other. However, the gate width of the first and the third active elements MC11, MC13 and the gate width of the second and the fourth active elements MC12, MC14 are substantially different.

In below, operation of the variable gain amplifier according to the present invention is illustrated with referring FIGS. 2 and 3.

The amplification unit 1100 amplifies voltage applied between the first and the second input terminals 101, 103 by controlling currents flowing through the first and the second output terminals 105, 107 in accordance with the voltages applied to the first and the second input terminal 101, 103, respectively.

The first gain control unit 1300 controls gain of the variable gain amplifier by controlling currents flowing thorough the first and the second output terminals 111, 113 in accordance with control voltages Vc+, Vc− applied to the first and the second control terminal 115, 117, respectively.

The second gain control unit 1500 controls gain of the variable gain amplifier by controlling currents flowing through the first and the second output terminals 121, 123 in accordance with control voltages Vc+, Vc− applied to the first and the second control terminal 125, 127, respectively.

More specifically, in the variable gain amplifier according to the present invention, the maximum amounts of currents flowing from drains of the first and the second active elements MA11, MA12 of the amplification unit 1100, respectively, are decided by + control voltage Vc+ and − control voltage Vc− applied to each control terminal of the first and the second gain control unit 1300, 1500. In other words, gain of the variable gain amplifier is increased in proportion to the difference between + control voltage Vc+ and − control voltage Vc−.

In the variable gain amplifier according to an embodiment, − control voltage Vc− is a constant voltage, and + control voltage Vc+ is variable from the − control voltage Vc− to a voltage of the voltage source VDD. In case that + control voltage Vc+ is substantially same that of the voltage source VDD, amount of each current flowing from drains of the first and the second active elements MA11, MA12 is half of bias current, when input voltages applied to the first and the second input terminal 101, 103 is in common state. In this case, if input voltages applied to the first and the second input terminals 101, 103 are swing, the drain currents of the first and the second active elements MA11, MA12 flows differentially, and amount of the drain currents is verified from substantially 0 to the bias current. Accordingly, gain is created in proportion to the drain currents. In this case, the variable gain amplifier has maximum gain.

In case that + control voltage Vc+ is substantially same with − control voltage Vc−, the variable gain amplifier according to the present invention has minimum gain, because minimum current flows by the difference of gate widths of the first and the third active elements MC11, MC13 and gate widths of the second and the fourth active elements MC12, MC14.

More specifically, if all of active elements has same gate width, the variable gain amplifier has infinite gain which is a minus value, because the sum of the drain currents of the first and the second active elements MC11, MC14, and the sum of drain currents of the second and the fourth active elements MC12, MC14 are substantially same each other, all the times.

On the other hand, the variable gain amplifier according to the present invention, the minimum value of gain is fixed to a specific value. Accordingly, gain slope of the variable gain amplifier is smaller than that of prior variable gain amplifier, and the scope for controlling gain of the variable gain amplifier is wide.

Figure 4:
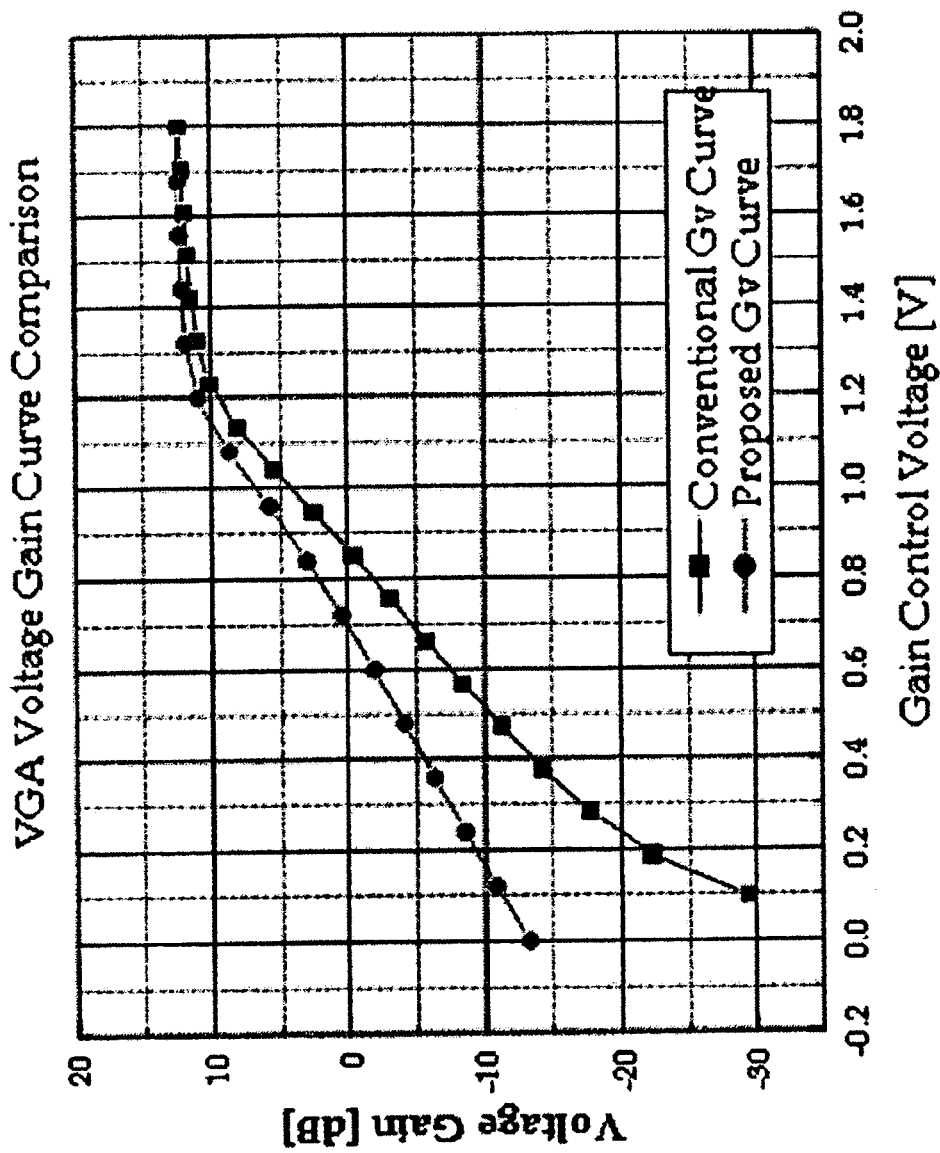
FIG. 4 shows gain curve of the variable gain amplifier according to the present invention.

FIG. 4 shows gain curve of the variable gain amplifier according to the present invention, and gain curve of prior variable gain amplifier, wherein gate widths of all active elements are substantially same.

As shown in FIG. 4, the minimum value of gain of the variable gain amplifier according to the present invention is fixed to a specific value, on the other hand the minimum value of gain of prior variable gain amplifier wherein gate widths of all active elements are substantially same is infinite value which is a minus value. Accordingly, gain curve of the variable gain amplifier according to the present invention has a gentle slope. Moreover, the scope of gain control is wider than that of prior art.

The Second Embodiment of the Variable Gain Amplifier

Figure 5:
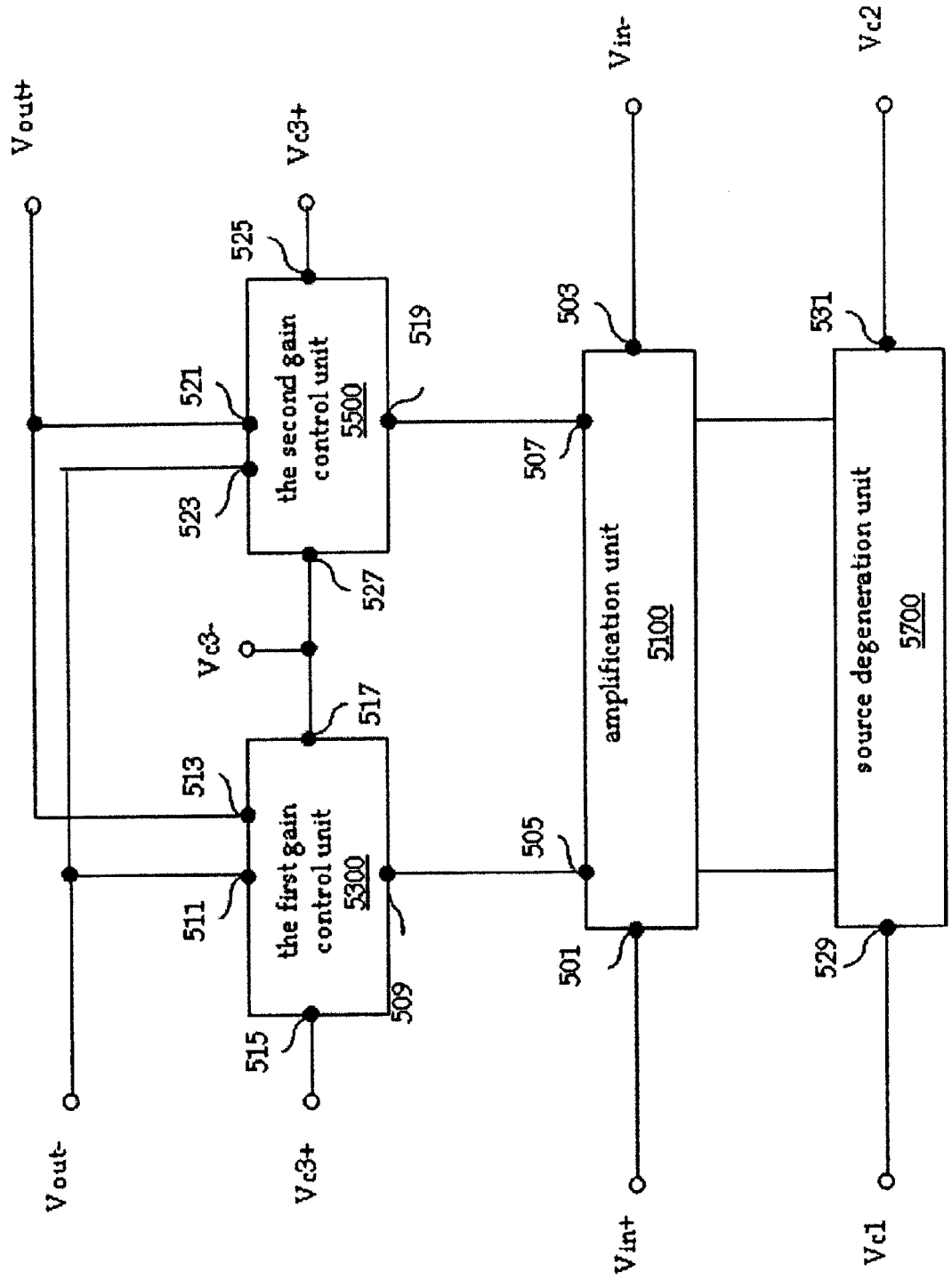
FIG. 5 is a block diagram showing a variable gain amplifier according to the second embodiment of the present invention.

FIG. 5 is a block diagram showing a variable gain amplifier according to the second embodiment of the present invention.

As shown in FIG. 5, the variable gain amplifier according to the present invention comprises an amplification unit 5100, the first gain control unit 5300, the second gain control unit 5500, and a source degeneration unit 5700.

The amplification unit 5100 has the first and the second input terminals 501, 503, and the first and the second output terminals 505, 507. The amplification unit 5100 amplifies input signals applied to the first and the second input terminals, differentially, and outputs the amplified signals to the first and the second output terminals, respectively.

The first gain control unit 5300 has an input terminal 509, the first and the second output terminals 511, 513, and the first and the second control terminals 515, 517. The first gain control unit 5300 controls current flowing through the first and the second output terminals 511, 513 according to third control signals Vc3+, Vc3− applied to the first and the second control terminals 515, 517, respectively.

The second gain control unit 5500 has an input terminal 519, the first and the second output terminals 521, 523, the first and the second control terminals 525, 527. The second gain control unit 5500 controls current flowing through the first and the second output terminals 521, 523 according to the third control signals Vc3+, Vc3− applied to the first and the second control terminal 525, 527, respectively.

The source degeneration unit 5700 has the first and the second control terminals 529, 531. The source degeneration unit 5700 controls linearity of the variable gain amplifier by verifying a degeneration impedance value according to the first and the second control signals Vc1, Vc2 applied to the first and the second control terminals 525, 527, respectively.

Below, connections of theses constructions are illustrated with referring FIG. 5.

The first and the second input terminals 501, 503 of the amplification unit 5100 form + input terminal Vin+, and − input terminal Vin− of the variable gain amplifier according to the present invention, respectively. The first output terminal 505 of the amplification unit 5100 is connected to the input terminal 509 of the first gain control unit 5300, and the second output terminal 507 of the amplification unit 5100 is connected to the input terminal 519 of the second gain control unit 5500.

The first output terminal 511 of the first gain control unit 5300 is connected to the second output terminal 523 of the second gain control unit 5500, and forms − output terminal Vout− of the variable gain amplifier according to the present invention. Moreover, the first output terminal 521 of the second gain control unit 5500 is connected to the second output terminal 513, and forms + output terminal Vout+ of the variable gain amplifier.

The first control terminal 515, 525 of the first and the second gain control units 5300, 5500 are connected to each other, and forms the third + control terminal Vc3+ of the variable gain amplifier. The second control terminals 517, 527 of the first and the second gain control unit 5300, 5500 are connected to each other, and forms the third − control terminal Vc3− of the variable gain amplifier.

Figure 6:
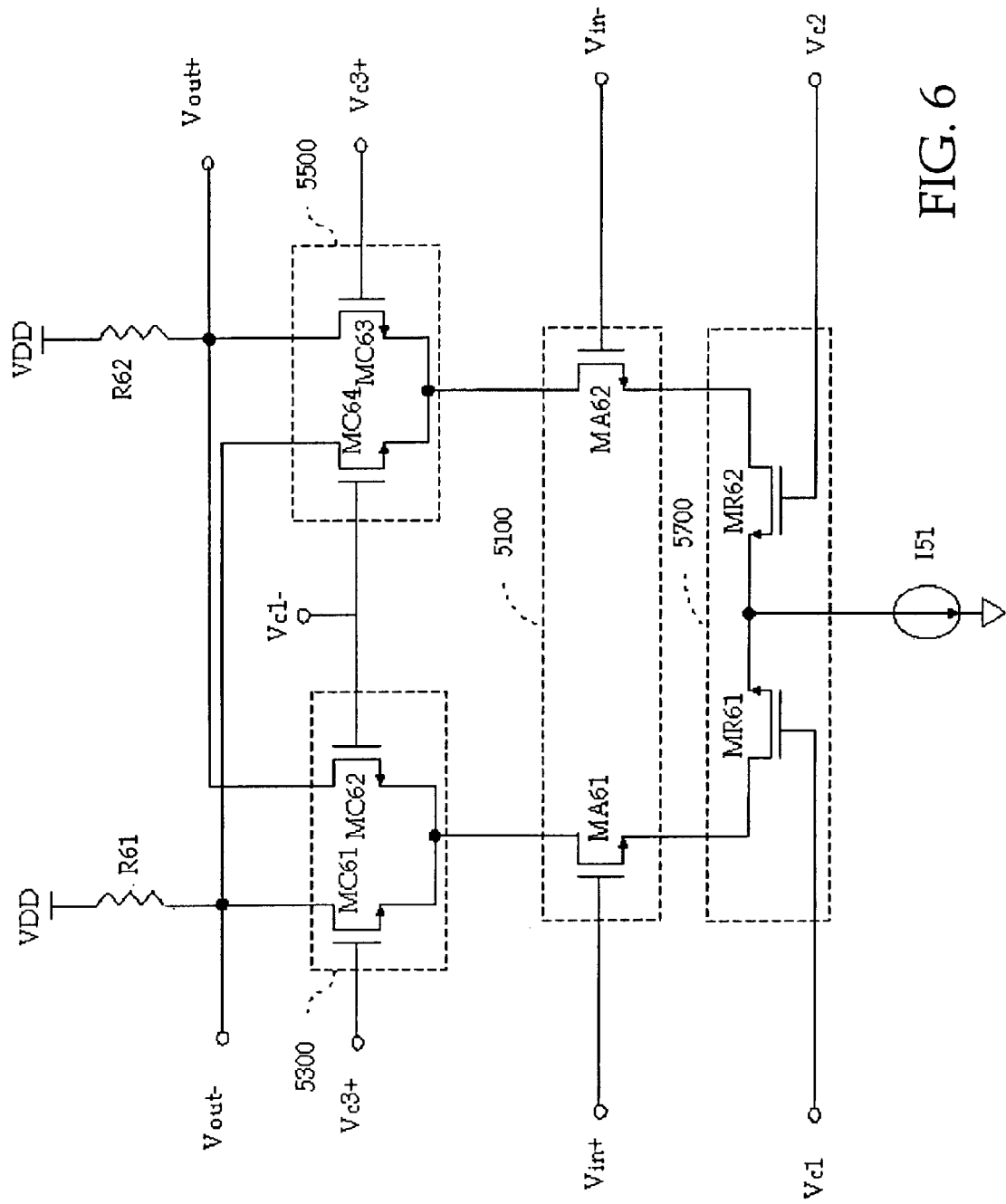
FIG. 6 is circuit diagram illustrating the variable gain amplifier shown in FIG. 6 according to an embodiment of the present invention.

The source degeneration unit 5700 is connected to the amplification unit 5100. In case that the variable gain amplifier is formed with using N type MOSFET transistors, as shown in FIG. 6, the source degeneration unit 5700 is connected between the amplification unit 5100 and ground. Moreover, the first and the second control terminals 529, 531 form the first and the second control terminals Vc1, Vc2.

FIG. 6 is circuit diagram illustrating the variable gain amplifier shown in FIG. 6 according to an embodiment of the present invention.

As shown in FIG. 6, the amplification unit 5100 comprises the first active element MA61, and the second active element MA62. The drains of the first and the second active elements MA61, MA62 form the first and the second output terminals 505, 507 of the amplification unit 5100, respectively. The gates of the first and the second active elements MA61, MA62 form the first and the second input terminals 501, 503 of the amplification unit 5100, respectively. Moreover, the sources of the first and the second active elements MA61, MA62 are connected to each other.

The first gain control unit 5300 comprises the first active element MC61, and the second active element MC62. Drains of the first and the second active elements MC61, MC62 form the first and the second output terminals 511, 513 of the first gain control unit 5300, respectively. Gates of the first and the second active elements MC61, MC62 form the first and the second control terminals 515, 517 of the first gain control unit 5300, respectively. Sources of the first and the second active elements MC61, MC62 are connected to each other, and form the input terminal 509 of the first gain control unit 5300.

The second gain control unit 5500 comprises the third active element MC63, and the fourth active element MC64. Drains of the third and the fourth active elements MC63, MC64 form the first and the second output terminals 521, 523 of the second gain control unit 5500, respectively. Gates of the third and the fourth active elements MC63, MC64 form the first and the second control terminals 525, 527 of the second gain control unit 5500, respectively. Sources of the third and the fourth active elements MC63, MC64 are connected to each other, and form the input terminal 519 of the second gain control unit 5500.

The source degeneration unit 5700 comprises the first active element MR61, and the second active element MR62. Drains of the first and the second active elements MR61, MR62 are connected to the sources of the first and the second active elements MA61, MA62 of the amplification unit 5100, respectively. Gates of the first and the second active elements MR61, MR62 form the first and the second control terminals 529, 531. And, Sources of the first and the second active elements MR61, MR62 are connected to each other.

As shown in FIG. 6, the variable gain amplifier according to an embodiment of the present invention which is formed with NMOS transistors, may comprises a current source 161 which is connected between connection point of sources of the first and the second active elements MR61, MR62 of the source degeneration unit 5700 and ground.

Moreover, the first output terminals 511, 521 of the first and the second gain control units 5300, 5500 are connected to the voltage source VDD. Moreover, impedances are preferably provided between the first output terminals 511, 521 of the first and the second gain control units 5300, 5500 and the voltage source VDD, as shown in FIG. 6.

Although control signals applied to the first, the second, and the third control terminals Vc1, Vc2, Vc3 of the variable gain amplifier are shown differently in FIG. 6, these control signals may be same according to another embodiment.

Below, operation of the variable gain amplifier according to the second embodiment is illustrated.

In case that a degeneration impedance of the variable gain amplifier is formed with MOS transistor, as shown in FIG. 6, the impedance value Rd of MOS transistor can be expressed as shown in equation 1, in linear region.

$$Rd = K\,L/W 1/(V_{GS} - V_T) \qquad \text{[Equation 1]}$$

In equation 1, the K is constant, W is gate width of the MOS transistor, L is gate length, the $V_{GS}$ is voltage between gate and source, and $V_T$ is threshold voltage of MOS transistor.

As shown in equation 1, the impedance value of the MOS transistor is inverse proportion to the voltage $V_{GS}$ applied between gate and source. Accordingly, impedance value of the source degeneration unit 5700 can be controlled by adjusting the first and the second control voltages Vc1, Vc2 applied to gates of the first and the second active elements MR61, MR62 of the source degeneration unit 5700.

More specifically, impedance value of the source degeneration unit 5700 is to be large when the first and the second control voltages Vc1, Vc2 is to be low. On the other hands, impedance value of the source degeneration unit 5700 is to be small in case that when the first and the second control voltages Vc1, Vc2 is to be high.

As apparent to the person skilled in the art, if the degeneration impedance value is to be large, linearity of the variable gain amplifier is improved, but gain characteristic becomes worse. On the other hand, if the degeneration impedance value is to be small, gain characteristic is improved, but linearity becomes worse.

Accordingly, linearity and gain characteristic of the variable gain amplifier according to the second embodiment of the present invention can be controlled with verifying the impedance value of the source generation unit 5700.

More specifically, when small signal is applied to the input terminals Vin+, Vin− of the variable gain amplifier, high gain characteristic is required. In this case, if one makes the third + control voltage Vc3+ to be increased, the gain of variable gain amplifier is to be high. Moreover, if one makes the first and the second control voltages Vc1, Vc2 to be increased, gain characteristic is further improved, because degeneration impedance value of the variable gain amplifier is to be low.

On the other hand, when high signal is applied to the input terminals Vin+, Vin− of the variable gain amplifier, high linearity and sensitivity is required. In this case, if one makes the third + control voltage Vc3− to be decreased, the gain of variable gain amplifier is to be low. Moreover, if one makes the first and the second control voltages Vc1, Vc2 to be decreased, linearity and sensitivity is further improved, because degeneration impedance value is to be high.

Therefore, linearity of a variable gain amplifier is a constant value in prior art whose degeneration impedance is formed with passive elements, but linearity is variable value in the variable gain amplifier whose degeneration impedance comprises active element according to the present invention.

Accordingly, the variable gain amplifier can operate optimally by increasing the control voltages Vc1, Vc2, Vc3+ if high gain characteristic is required, and decreasing the control voltages Vc1, Vc2, Vc3+ if high linearity characteristic is required.

INDUSTRIAL APPLICABILITY

According to the present invention, gain slope characteristic of a variable gain amplifier is improved by fixing minimum value of gain by setting amplification rate of the first and the third active elements which are substantially same, and amplification rate of the second and the fourth active elements which are substantially same be different, each other.

Moreover, high gain amplification operation can be supported when small signal is inputted, and high linearity operation can be supported when high signal is inputted, by using degeneration impedance that comprises active elements.

What is claimed is:

1. A variable gain amplifier comprising:
   (a) an amplification unit for amplifying input signals applied to first and second input terminals, differentially, and outputting the amplified signals to first and second output terminals, respectively;
   (b) first gain control unit having an input terminal, first and second output terminals, and first and second control terminals, wherein said first gain control unit controls currents flowing through the first and the second output terminals according to third + and − control signals applied to the first and the second control terminals, respectively;
   (c) second gain control unit having an input terminal, first and second output terminals, and first and second control terminals, wherein said second gain control unit controls current flowing through the first and the second output terminals according to the third + and − control signals applied to the first and the second control terminals, respectively; and
   (d) a degeneration impedance unit having first and second control terminals, and operably connected between the amplification unit and first voltage source, whose impedance value is controlled by first and second control signals,
   wherein the first and the second input terminals of said amplification unit form + and − input terminals, respectively, and the first and the second output terminals of said amplification unit are connected to input terminals of said first and said second gain control units, respectively, and
   wherein the first output terminal of said first gain control unit is connected to the second output terminal of said second gain control unit, and forms − output terminal, and the second output terminal of said first gain control unit is connected to the first output terminal of said second gain control unit, and forms + output terminal.

2. The variable gain amplifier of claim 1, wherein said amplification unit comprises first and second NMOS transistors whose drains form the first and the second output terminals of said amplification unit, respectively, gates form the first and the second input terminals of said amplification unit, and sources are connected said degeneration impedance unit.

3. The variable gain amplifier of claim 1, wherein said degeneration impedance unit comprises first and second NMOS transistors whose drains are connected to the sources of the first and second active elements of said amplification unit, respectively, gates form the first and second control terminals, sources are connected to each other.

4. The variable gain amplifier of claim 1, wherein said first gain control unit comprises first and second NMOS transistor whose drains form the first and the second output terminals, respectively, gates form the first and the second control terminals, respectively, and sources are connected to each other, and form the input terminal, and
   wherein the second gain control unit comprises first and second NMOS transistors whose drains form the first and the second output terminals, respectively, gates form the first and the second control terminals, respectively, and sources are connected to each other, and form the input terminal.

5. The variable gain amplifier of claim 1, wherein the first and the second control signals, and the third + control signal are substantially same.

* * * * *